(12) United States Patent
Prakash et al.

(10) Patent No.: US 11,223,368 B1
(45) Date of Patent: Jan. 11, 2022

(54) INTER-CHANNEL CROSSTALK AND NON-LINEARITY REDUCTION IN DOUBLE-SAMPLED SWITCHED-CAPACITOR DELTA-SIGMA DATA CONVERTERS

(71) Applicant: CIRRUS LOGIC INTERNATIONAL SEMICONDUCTOR, LTD., Edinburgh (GB)

(72) Inventors: Chandra Prakash, Austin, TX (US); Saurabh Singh, Cedar Park, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 17/061,939

(22) Filed: Oct. 2, 2020

(51) Int. Cl.
H03M 3/00 (2006.01)

(52) U.S. Cl.
CPC ........... *H03M 3/358* (2013.01); *H03M 3/352* (2013.01); *H03M 3/422* (2013.01); *H03M 3/494* (2013.01)

(58) Field of Classification Search
CPC ...... H03M 3/358; H03M 3/422; H03M 3/494; H03M 3/352
See application file for complete search history.

(56) References Cited

U.S. PATENT DOCUMENTS

| | | | |
|---|---|---|---|
| 5,905,453 A * | 5/1999 | Kase | H03M 3/332 341/143 |
| 6,670,902 B1 | 12/2003 | Melanson et al. | |
| 6,873,276 B2 | 3/2005 | Yang et al. | |
| 6,956,514 B1 | 10/2005 | Melanson et al. | |
| 9,407,279 B2 | 8/2016 | Melanson et al. | |
| 9,866,237 B1 * | 1/2018 | Thinakaran | H03H 19/004 |
| 2006/0012499 A1 * | 1/2006 | Ihs | H03M 3/352 341/143 |
| 2008/0024342 A1 * | 1/2008 | Deval | H03M 3/34 341/143 |
| 2011/0012767 A1 * | 1/2011 | Deval | H03M 1/0663 341/143 |
| 2011/0163901 A1 * | 7/2011 | Quiquempoix | H03M 1/0665 341/143 |
| 2013/0020018 A1 * | 1/2013 | Song | C23C 14/048 156/230 |
| 2021/0239540 A1 * | 8/2021 | Dwivedi | G05F 3/245 |

* cited by examiner

*Primary Examiner* — Lam T Mai
(74) *Attorney, Agent, or Firm* — Mitch Harris, Atty at Law, LLC; Andrew M. Harris (57) ABSTRACT

A switched-capacitor delta-sigma data converter circuit includes compensation for voltage reference error that may cause non-linearity and inter-channel crosstalk. The circuit includes a voltage reference circuit, an integrator, a quantizer that quantizes the output of the integrator and a reference feedback switched-capacitor network that provides feedback charge quanta to the integrator that represents an output of the quantizer, so that the output of the quantizer, on average, represents an input signal provided to the integrator. In addition, a compensation switched-capacitor network is included for drawing dummy load charge quanta from the voltage reference output that is not provided to the integrator so that a total charge drawn from the voltage reference output when the reference feedback switched-capacitor network is coupled to the voltage reference output does not vary as the input voltage varies.

21 Claims, 6 Drawing Sheets

INTER-CHANNEL CROSSTALK AND NON-LINEARITY REDUCTION IN DOUBLE-SAMPLED SWITCHED-CAPACITOR DELTA-SIGMA DATA CONVERTERS

BACKGROUND

1. Field of Disclosure

The field of representative embodiments of this disclosure relates to methods and circuits that reduce inter-channel crosstalk and non-linearity due to voltage reference variation in switched-capacitor delta-sigma data converter circuits.

2. Background

Voltage references directly affect the accuracy of data converters such as analog-to-digital converters (ADCs), digital-to-analog converters (DACs), and other circuits in which comparison of a voltage level to a precision reference is performed. In most switched-capacitor delta-sigma data converters, the application of the reference voltage is made by a reference switched-capacitor network that applies samples of the voltage reference as feedback charge quanta that cancel an input voltage provided to the integrator of the delta-sigma data converter.

Particularly in switched-capacitor delta-sigma data converters such as those disclosed in U.S. Pat. No. 6,147,522, which have a two-phase reference application in coarse and fine phases, variation in reference voltage occurs due to changes in the amount of reference capacitance connected to the fine reference at each cycle. The variation in reference voltage causes issues with both channel-to-channel crosstalk when converters share common coarse and fine reference nodes and non-linearity generally, as different quantizer output codes cause variation in the reference capacitance at each cycle. The coarse reference is typically provided from a voltage reference buffer and the fine reference is typically a filter capacitor that has been previously charged to a voltage of the output of the voltage reference buffer and then disconnected at the time of reference feedback application, so that noise on the output of the voltage reference buffer does not affect conversion accuracy. In the coarse reference application phase, the majority of the charge for the phase is transferred with a lesser accuracy due to voltage reference noise. In a subsequent fine reference application phase that transfers a small portion of the charge for the phase without the voltage reference noise, since the charge for the fine phase is supplied from the filter capacitor. Due to changes in the number of and/or capacitance of the reference feedback capacitors selected according to the quantizer output and connected to the filter capacitor at each conversion cycle, and the previous state of charge on the selected reference capacitors, the step in voltage across the filter capacitor changes with the output of the quantizer. Further, if the filter capacitor is used to supply the fine reference for multiple converter circuits, then the variations are exacerbated by the number of capacitors selected at each cycle among the multiple converter circuits, leading to cross-talk between converter channels as the fine reference varies.

Therefore, it would be advantageous to reduce the cross-talk and non-linearities due to variations in the fine reference voltage in two-phase switched-capacitor feedback delta-sigma data converters.

SUMMARY

Improved delta-sigma data converter operation is accomplished in delta-sigma data converter circuits and their methods of operation.

The switched-capacitor delta-sigma data converter circuits include a voltage reference circuit that provides a voltage reference output, an integrator with an input for receiving an input voltage, a quantizer for generating a digital value quantizing an output of the integrator, a reference feedback switched-capacitor network alternatively coupled between the voltage reference output and the integrator for providing feedback charge quanta representing an output of the quantizer so that the output of the quantizer, on average, represents the input voltage, and a compensation switched-capacitor network alternatively coupled to the voltage reference output and a return current path for drawing dummy load charge quanta from the voltage reference output that is not provided to the integrator so that a total charge drawn from the voltage reference output when the reference feedback switched-capacitor network is coupled to the voltage reference output does not vary as the input voltage varies.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses switched-capacitor delta-sigma data converter circuits that include compensation for voltage reference error that may cause non-linearity and inter-channel crosstalk. The voltage reference error is caused by a difference in the number of reference feedback capacitors that need to be charged between each converter sampling cycle, as the quantizer output changes with the input signal and in a double-sampled delta-sigma data converter, the amount of charge transferred from the reference varies when the code changes, since not all of the reference feedback capacitors will change charge state at that transition. The result is a signal-dependent variation in the reference voltage, since the difference in the amount of reference feedback charge transferred at each cycle appears on the voltage reference output as a change in voltage, which causes inter-channel cross-talk for circuits that have multiple data converters sharing a common filter circuit and voltage reference, as well as signal-dependent non-linearity in even signal converter circuits. The switched-capacitor data converter circuit includes a voltage reference circuit, an integrator, a quantizer that quantizes the output of the integrator and a reference feedback switched-capacitor network that provides feedback charge quanta to the integrator that represents an output of the quantizer, so that the output of the quantizer, on average, represents an input signal provided to the integrator. A compensation switched-capacitor network is included for drawing dummy load charge quanta from the voltage reference output that is not provided to the integrator so that a total charge drawn from the voltage reference output when the reference feedback switched-capacitor network is coupled to the voltage reference output does not vary as the input voltage varies.

Figure 1:
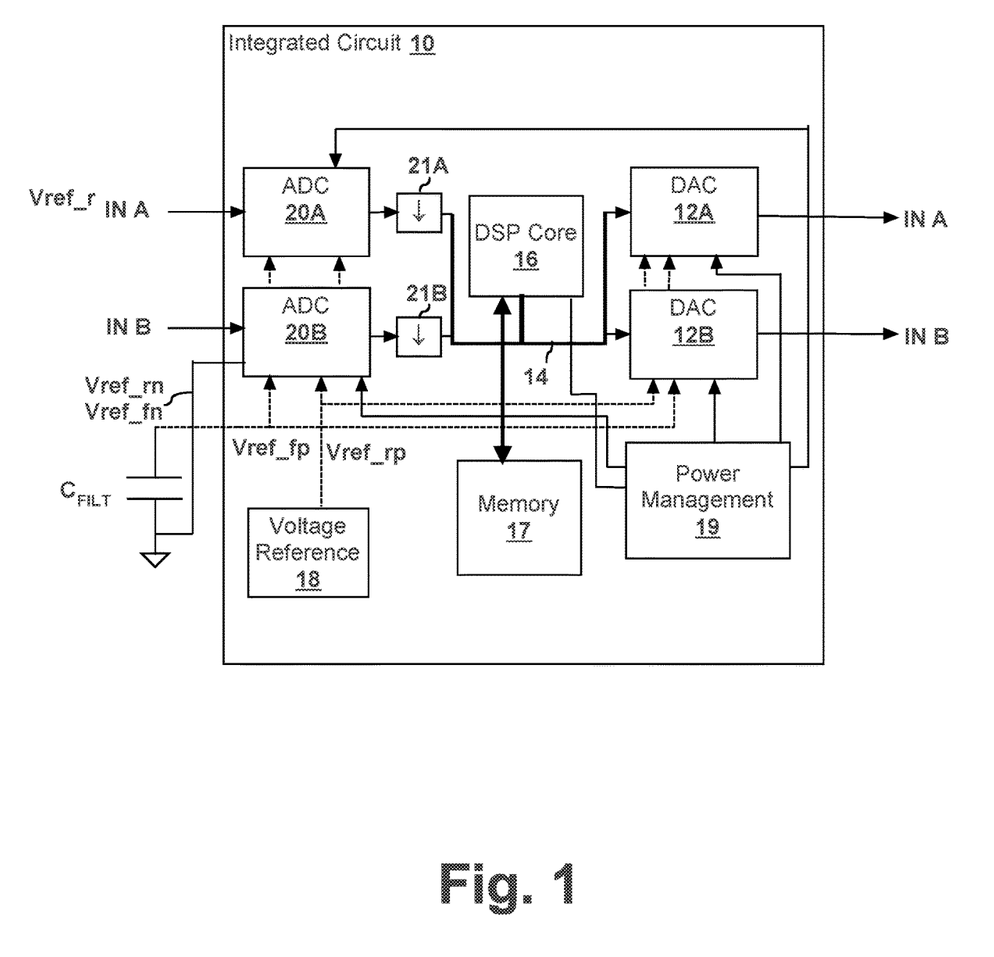
FIG. 1 is a block diagram of an example integrated circuit 10 according to an embodiment of the disclosure.

Referring now to FIG. 1, an example of an integrated circuit (IC) 10 that may be, for example, a CODEC or SoC integrated circuit, in accordance with an embodiment of the disclosure. Two input signals IN A, IN B are received by a pair of respective ADCs 20A, 20B and converted to streams of digital samples, which are reduced in rate by a pair of respective decimators 21A, 21B, the outputs of which are delivered to a digital signal processor (DSP) core 16 over a pulse code modulation (PCM) bus 14. PCM bus 14 also delivers output samples from DSP core 16 to a pair of digital-to-analog converters 12A, 12B, which generate output signals OUT A, OUT B. DSP 16 is coupled to a memory 17 that stores program instructions and data, including audio data. Thus, when properly programmed, integrated circuit provides an example of a generalized two-channel digital audio processing system with analog inputs and outputs. Two common reference voltages Vref_fp and Vref_rp are supplied to each of ADCs 20A, 20B and to DACs 12A, 12B. Reference voltage Vref_rp provides a voltage reference that is used during a rough charge transfer phase in ADCs 20A, 20B and DACs 12A, 12B and is generally provided from the output of a voltage reference buffer amplifier, including the consequent noise present at the amplifier output. Reference voltage Vref_fp is provided from an external filter capacitor $C_{FILT}$ that is not connected to the output of voltage reference 18, and is used in a fine charge transfer phase subsequent to the rough charge transfer phase, which eliminates the noise that would be generated across filter capacitor $C_{FILT}$ by such a connection. A complementary pair of rough charge transfer and fine charge transfer phase voltage references Vref_rn and Vref_fn, respectively, are provided from ground in the depicted embodiment, but could alternatively be provided from symmetric voltage references and filter capacitors, or a differential voltage reference buffer having outputs connected to the terminals of a single filter capacitor. Instead of a connection to the output of voltage reference 18, filter capacitor $C_{FILT}$ is charged to reference voltage $V_{REF\_RP}$ by intermittent connection of charge transfer circuits within ADCs 20A, 20B and DACs 12A, 12B, as will be described in further detail below. A power management block 19 enables and disables the various ADCs 20A, 20B and DACs 12A, 12B according to commands received from DSP core 16.

Figure 2:
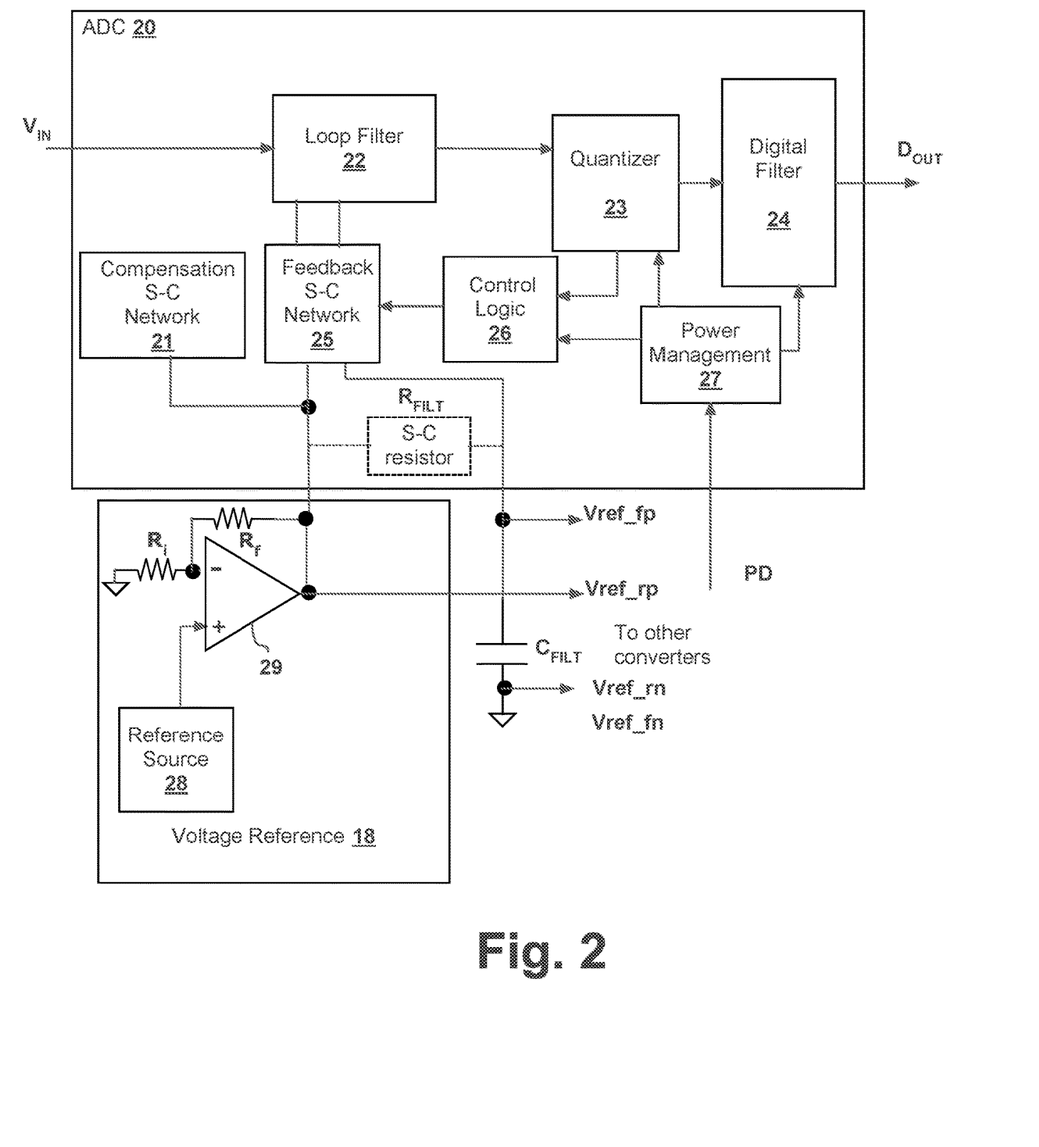
FIG. 2 is a block diagram of an example analog-to-digital converter (ADC) 20 connected to an example voltage reference circuit 18, in accordance with an embodiment of the disclosure, as may be employed in integrated circuit 10 of FIG. 1.

Referring now to FIG. 2, an example ADC 20 that may be used to implement ADCs 20A and 20B of FIG. 1, is shown, in accordance with an embodiment of the disclosure. While the principles illustrated herein are illustrated with respect to the example of a delta-sigma ADC circuit, the reduction of signal-dependent variation and channel cross-talk in the fine reference voltage apply equally to delta-sigma DAC circuits. An input voltage $V_{IN}$ is received by an analog loop filter 22 that integrates input voltage $V_{IN}$ to generate an output supplied to an input of a quantizer 23 that generates a digital input that is filtered by a digital filter 24 to generate an output $D_{OUT}$ of ADC 20. A power management block 27, responsive to an external power down control signal PD, places ADC 20 in a power-down state and restores ADC 20 to operation on de-assertion of power down control signal PD. A feedback capacitor network 25 is selectively operated by an output of quantizer 23 to apply a reference voltage to loop filter 22 to complete the delta-sigma converter loop. A control logic 26 generates the clock phase signals that control operation of feedback capacitor network 25, and may include dynamic element matching (DEM) rotation of feedback capacitors forming feedback capacitor network 25 to reduce variation due to differences in capacitance of the capacitors within feedback capacitor network 25 having an effect on linearity due to an otherwise fixed relationship between the individual capacitors and the output codes of quantizer 23. However, DEM is not a requirement of the circuits disclosed herein, and the techniques of the present disclosure also apply to non-DEM implementations. As to the signal-dependent variations described above, which are due to differences in the number of capacitors within feedback capacitor network 25 and the state of the voltages across the capacitors within feedback capacitor network 25 due to the prior state of the quantizer, ADC 20 includes a compensation capacitor network 21, which under conditions determined by control logic 26, applies a number of compensation capacitors effectively in parallel with the reference feedback switched-capacitor network 25 to maintain a constant capacitance in each phase in which charge is transferred from the output of voltage reference 18 to feedback capacitor network 25. Charge transferred to reference feedback switched-capacitor network 25 contributes to the charge supplied to loop filter 22 to cancel input signal $V_{IN}$, while charge transferred to capacitors in compensation capacitor network 21 are dummy load charge quanta.

Voltage reference 18 supplies reference voltage $V_{REF\_R}$ to feedback capacitor network 25 during rough charge transfer clock phases, and filter capacitor $C_{FILT}$ supplies reference voltage $V_{REF\_F}$ to feedback capacitor network 25 during fine charge transfer clock phases. Voltage reference 18 includes a voltage reference buffer amplifier 29 which receives input from a reference source 28, such as a bandgap or Zener source, and scales the voltage of reference source 28 to the required value of Vref_rp by a gain set by feedback resistor $R_f$ and input resistor $R_i$. Voltage reference circuit 18, while not directly connected to filter capacitor $C_{FILT}$, charges filter capacitor $C_{FILT}$ indirectly by the intermittent switching of capacitors in feedback capacitor network 25 between the output of voltage reference 18 during the rough charge transfer phases and to filter capacitor $C_{FILT}$ during the fine charge transfer phases, as will be described in further detail below. The switching of feedback capacitor network 25 therefore acts as a switched-capacitor resistor $R_{FILT}$, which is illustrated in FIG. 2 as a resistor, but is provided by the switching action of the feedback capacitor network 25. This switched-capacitor resistor $R_{FILT}$ forms an RC low-pass filter with filter capacitor $C_{FILT}$, which removes high-frequency noise, while disconnection of filter capacitor $C_{FILT}$ from any reference circuitry during the fine mode charge transfer phase prevents the noise present on the output of voltage reference buffer 29 from appearing in the measurement of input signal $V_{IN}$. While voltage reference filter capacitor $C_{FILT}$ is exemplified by an external capacitor as described and illustrated herein, external connection is not a limitation of the present disclosure, and the embodiments of the present disclosure should be considered as applying to voltage references with internally-formed filter capacitors.

Figure 3:
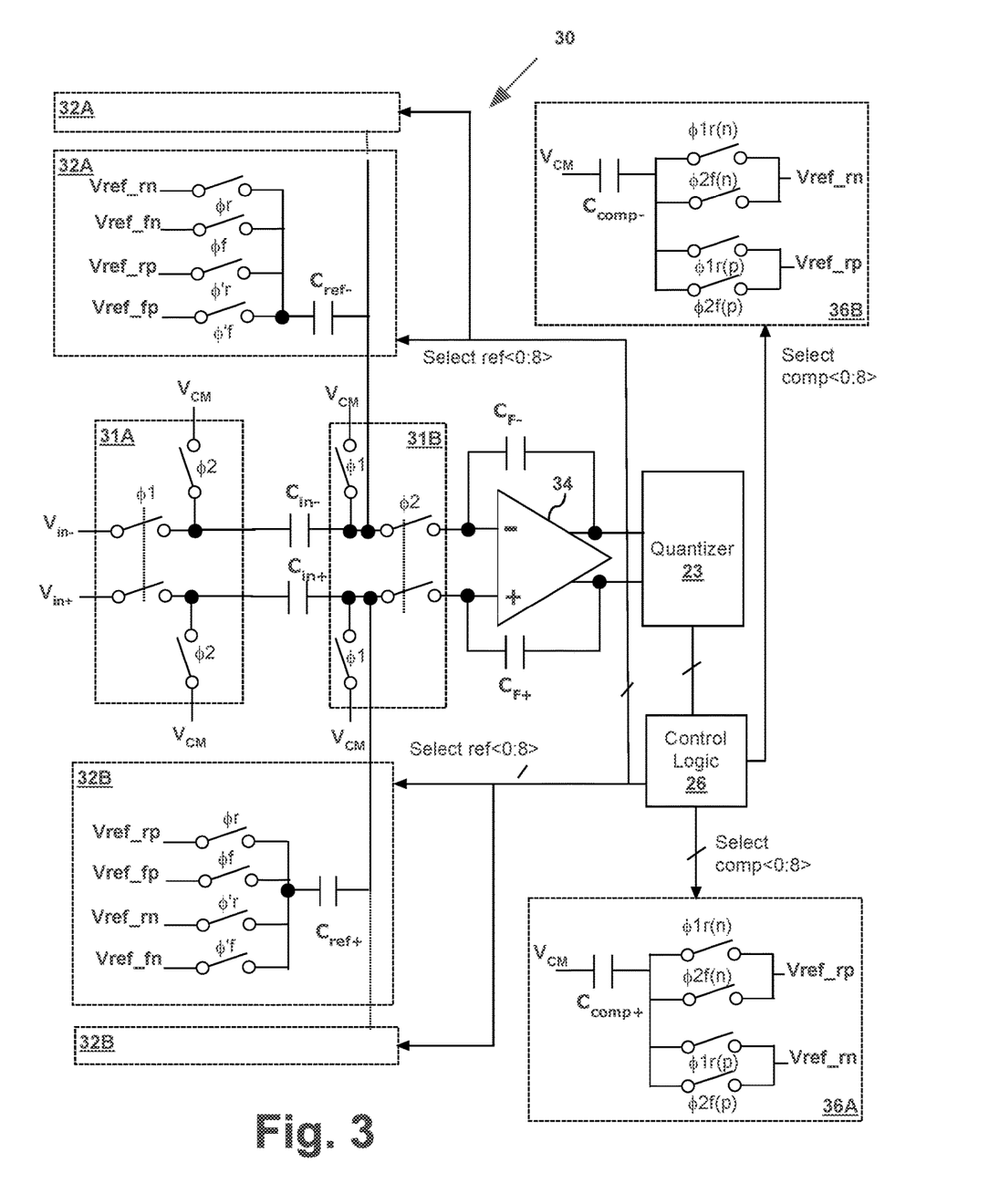
FIG. 3 is a schematic diagram showing an example delta-sigma loop circuit 30, in accordance with an embodiment of the disclosure, as may be employed in ADC 20 of FIG. 2.
Figure 5:
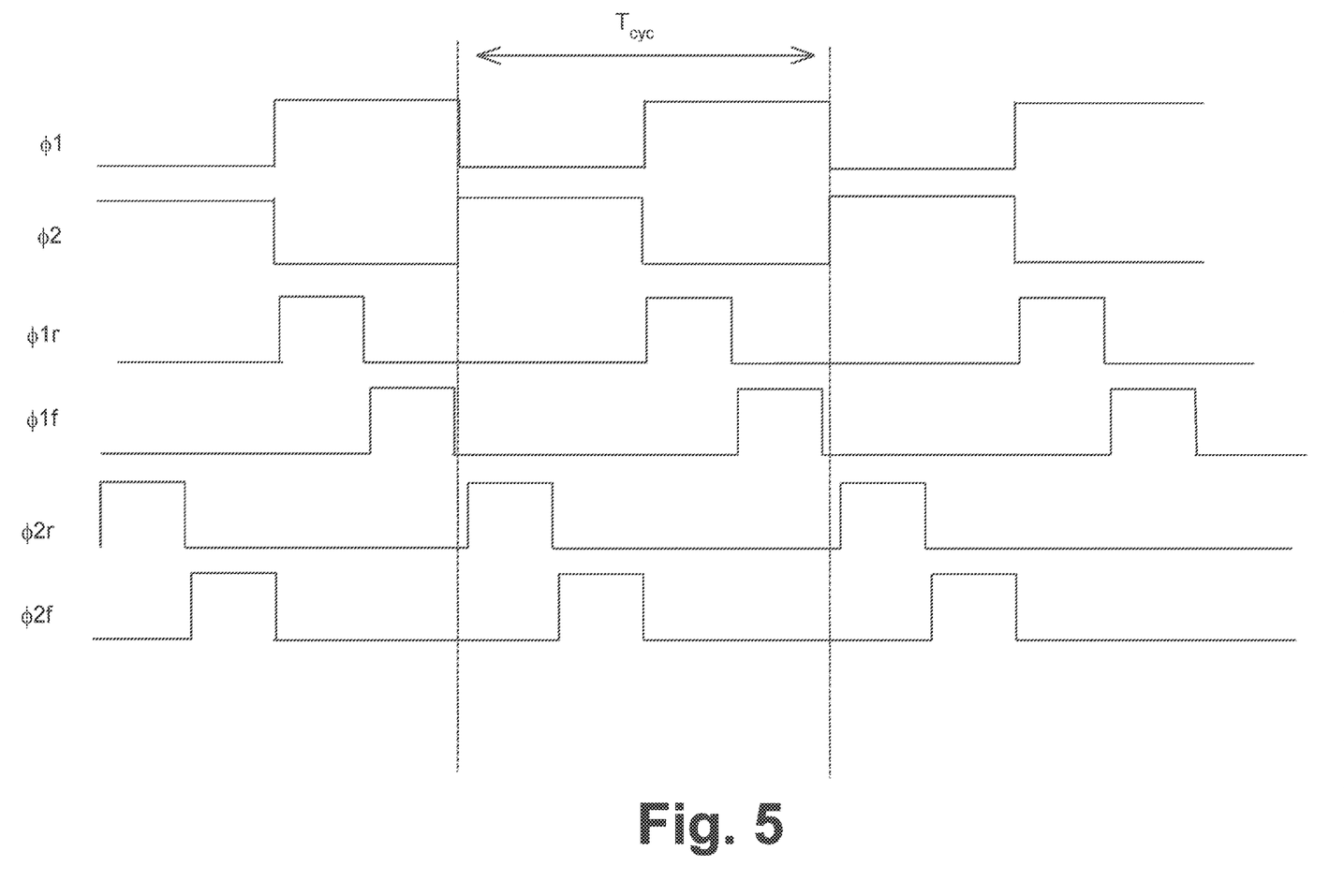
FIG. 5 is a timing diagram depicting example operation of delta-sigma loop circuit 30 of FIG. 3, in accordance with an embodiment of the disclosure.

Referring now to FIG. 3, details of an example delta-sigma loop circuit 30 that may be used to implement portions of ADC 20, are shown, in accordance with an embodiment of the disclosure. An integrator is provided by an operational amplifier 34 having feedback capacitors $C_{F-}$, $C_{F+}$ in a full differential configuration and input resistances provided by a switched capacitor network that includes an input switching network 31A, capacitors $C_{in-}$, $C_{in+}$ and a summing node switching network 31B. Differential input signal pair $V_{in-}$, $V_{in+}$ are sampled on alternate clock phases φ1 and φ2 as further illustrated in the timing diagram of FIG. 5. As shown in FIG. 5, Clock phases φ1 and φ2 make up a full sampling cycle of delta-sigma loop circuit 30 and correspond to one output of quantizer 23. Clock phases φ1 and φ2 each correspond to a separate reference feedback application cycle, each of which include a rough charge transfer phase φ1r, φ2r, in which reference capacitors $C_{ref-}$, $C_{ref+}$ in reference feedback switched-capacitor networks 32A, 32B, transfer charge from voltage reference 18 output that provides positive rough phase reference voltage Vref_rp or the opposite polarity rough phase reference Vref_rn, which in the instant embodiment is taken from ground. Each of clock phases φ1 and φ2 also include a fine charge transfer phase φ1f, φ2f, in which the reference capacitors $C_{ref-}$, $C_{ref+}$ transfer charge from filter capacitor $C_{FILT}$, providing a more accurate reference voltage that does not include noise from the various voltage reference noise sources mentioned above. Whether the individual reference capacitors $C_{ref-}$, $C_{ref+}$ in reference feedback switched-capacitor networks 32A, 32B are charged to the positive reference voltages Vref_rp and Vref_fp or to negative reference voltages Vref_rn and Vref_fn is determined according to the code at the output of quantizer 23 and from which control logic 26 generates a selection word Select ref <0:8>. If the bit in selection word Select ref <0:8> corresponding to a given capacitor is set, the φr, φf phases correspond to φ1r, φ1f, and if the bit is reset, to φ2r, φ2f. Similarly, the alternate φ'r, φ'f phases correspond to φ2r, φ2f if the bit is set, and if the bit is reset, to φ1r, φ1f. Since the polarity of the reference voltages for the φr, φf in reference feedback capacitor network 32B are opposite the polarity of the reference voltages in reference feedback capacitor network 32A for the φr, φf phases, and similarly for the φ'r, φ'f phases, for a given quantizer code the reference charge transfer is effectively performed twice with the same polarity with respect to the integrator formed around amplifier 34, which doubles the gain and also provides a null in the response at the sampling frequency, which improves performance of the delta-sigma loop circuit 30.

Due to the above-described double-sampling operation and structure, the number of reference capacitors selected for a given polarity by reference feedback switched-capacitor networks 32A, 32B are swapped between clock phases φ1 and φ2. For example, if four reference capacitors are selected for positive charging from reference feedback switched-capacitor network 32A and five reference capacitors are selected from reference feedback switched-capacitor network 32B for negative charging in clock phase φ1, then in clock phase φ2, five reference capacitors are selected for negative charging from reference feedback switched-capacitor network 32A and four reference capacitors are selected from reference feedback switched-capacitor network 32B for negative charging, as illustrated in Table I below for a reference feedback switched-capacitor network having nine capacitors. The remainder of the capacitors in reference feedback switched-capacitor networks 32A, 32B are charged to the opposite polarities in the given clock phases. Since, for a given quantizer code Q, at each clock phase transition between clock phases φ1, φ2, the selection of the capacitors within reference feedback switched-capacitor networks 32A, 32B are swapped, all nine of the capacitors will change charge state at each clock cycle. During the rough clock phase, a given capacitor is either charged to Vref_rp or discharged to reference voltage Vref_rn, which is ground in the depicted embodiment. Therefore, the amount of the step in voltage at the output of voltage reference 18 due to the charging of reference feedback switched-capacitor networks 32A, 32B is the same at each clock phase. However, when the quantizer code changes, the number of selected capacitors changes between clock phase φ2 of the last cycle and clock phase φ1 of the new cycle, at least one of the newly selected capacitors will not change charge state, as illustrated by the bold entries in Table I. Vrefp and Vrefn are used in Table I to refer to polarity of the voltage reference, since it is only reference voltage Vref_rp, i.e., the output of voltage reference 18 that is being affected by the difference in loading by reference feedback switched-capacitor networks 32A, 32B when the quantizer code changes transitioning into clock phase φ1, and it is only reference voltage Vref_rp being loaded by the compensation capacitors when needed. For the above reason, the number of compensation capacitors changing state as selected by compensation capacitor networks 36A, 36B is equal to the number of capacitors in reference feedback switched-capacitor networks 32A, 32B that are not changing charge state. The switches in compensation capacitor networks 36A, 36B are operated at rough phase φ1 with polarity selected by selection word Select comp<8:0>, so that capacitors Ccomp+, Ccomp− are always maintained at their previous charge state unless compensation is needed for one or more reference capacitors that did not change state at the transition into clock phase φ1 of the next quantizer cycle. In that case, a bit will be set in Select comp<8:0> for each such capacitor, so that in the rough charging portion of clock phase φ1, charge will be drawn by one or more of compensation capacitors Ccomp+, Ccomp− from the output of voltage reference 18, i.e., for the one or more of Ccomp+, Ccomp− that is being changed in voltage from Vrefn (ground) to Vrefrp, so that the total step load on voltage reference 18 remains equal to the full charge required to change the charge state of the number of reference capacitors in each of reference feedback switched-capacitor networks 32A, 32B from ground to Vrefrp. Similarly, fine phase φ2f(p) and φ2f(n) operate their respective switches compensation capacitor networks 36A, 36B, which is performed only to compensate for any residual droop in voltage across compensation capacitors Ccomp+, Ccomp− at the end of the complete quantizer cycle. While compensation capacitor networks 36A, 36B are shown as separate capacitor networks for symmetry, since the capacitors selected by compensation capacitor networks 36A, 36B are only applied to the output of voltage reference 18 and not to the integrator of delta-sigma loop circuit 30, a single set of compensation capacitors for loading the output of voltage reference 18 could be employed.

TABLE I

| φ1 | + | Vrefp | Vrefp | Vrefp | Vrefp | Vrefn | Vrefn | Vrefn | Vrefn | Vrefn | Q = 4 | #comp = ? |
| φ2 | − | Vrefn | Vrefn | Vrefn | Vrefn | Vrefp | Vrefp | Vrefp | Vrefp | Vrefp | Q = 4 | #comp = 0 |
| φ1 | + | Vrefp | Vrefp | Vrefp | Vrefp | Vrefn | Vrefn | Vrefn | Vrefn | Vrefn | Q = 5 | #comp = 1 |
| φ2 | − | Vrefn | Vrefn | Vrefn | Vrefn | Vrefp | Vrefp | Vrefp | Vrefp | Vrefp | Q = 5 | #comp = 0 |
| φ1 | + | Vrefp | Vrefp | Vrefp | Vrefp | Vrefp | Vrefp | Vrefp | Vrefn | Vrefn | Q = 2 | #comp = 2 |
| φ2 | − | Vrefn | Vrefn | Vrefn | Vrefn | Vrefn | Vrefn | Vrefn | Vrefp | Vrefp | Q = 2 | #comp = 0 |

For clarity of illustration, Table 1 does not include any details of DEM implementation, which may be included in the control logic 26 that operates reference feedback switched-capacitor networks 32A, 32B, and optionally compensation capacitor networks 36A, 36B. Table II below shows operation of reference feedback capacitor networks 32A, 32B with DEM included. Since only the position of the capacitor charge polarity selection changes within the groups of capacitors in reference feedback switched-capacitor networks 32AB, 32B, and not their numbers, the capacitors that do not change charge state shown in bold text only shift with the DEM rotation, but their quantities do not change. If DEM is also employed in compensation capacitor networks 36A, 36B, the actual capacitor polarities selected will rotate through the groups of capacitors in compensation capacitor networks 36A, 36B, but their quantities will likewise not change due to the rotation.

TABLE II

| φ1 | + | Vrefp | Vrefp | Vrefp | Vrefp | Vrefn | Vrefn | Vrefn | Vrefn | Vrefn | Q = 4 | #comp = ? |
| φ2 | − | Vrefn | Vrefn | Vrefn | Vrefn | Vrefp | Vrefp | Vrefp | Vrefp | Vrefp | Q = 4 | #comp = 0 |
| φ1 | + | Vrefp | Vrefp | Vrefp | Vrefp | Vrefn | Vrefn | Vrefn | Vrefn | Vrefp | Q = 5 | #comp = 1 |
| φ2 | − | Vrefn | Vrefn | Vrefn | Vrefn | Vrefp | Vrefp | Vrefp | Vrefp | Vrefn | Q = 5 | #comp = 0 |
| φ1 | + | Vrefp | Vrefp | Vrefp | Vrefp | Vrefp | Vrefn | Vrefn | Vrefp | Vrefp | Q = 2 | #comp = 2 |
| φ2 | − | Vrefn | Vrefn | Vrefn | Vrefn | Vrefn | Vrefp | Vrefp | Vrefn | Vrefn | Q = 2 | #comp = 0 |

Figure 4:
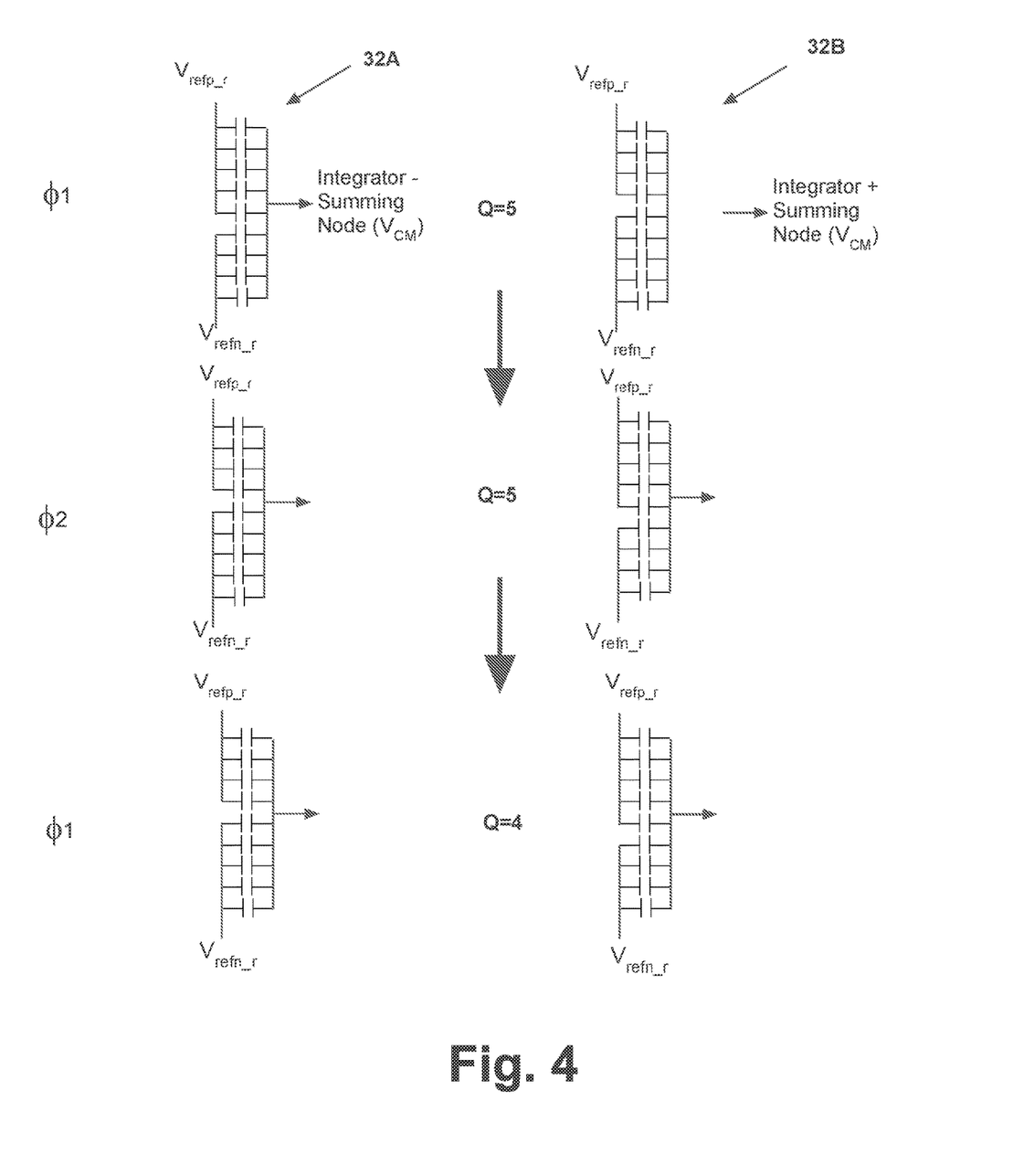
FIG. 4 is a pictorial diagram depicting an example switching sequence in delta-sigma loop circuit 30 of FIG. 3.

FIG. 4 illustrates switching of capacitors within reference feedback switched-capacitor networks 32A, 32B for the first three rows of Table II.

Figure 6:
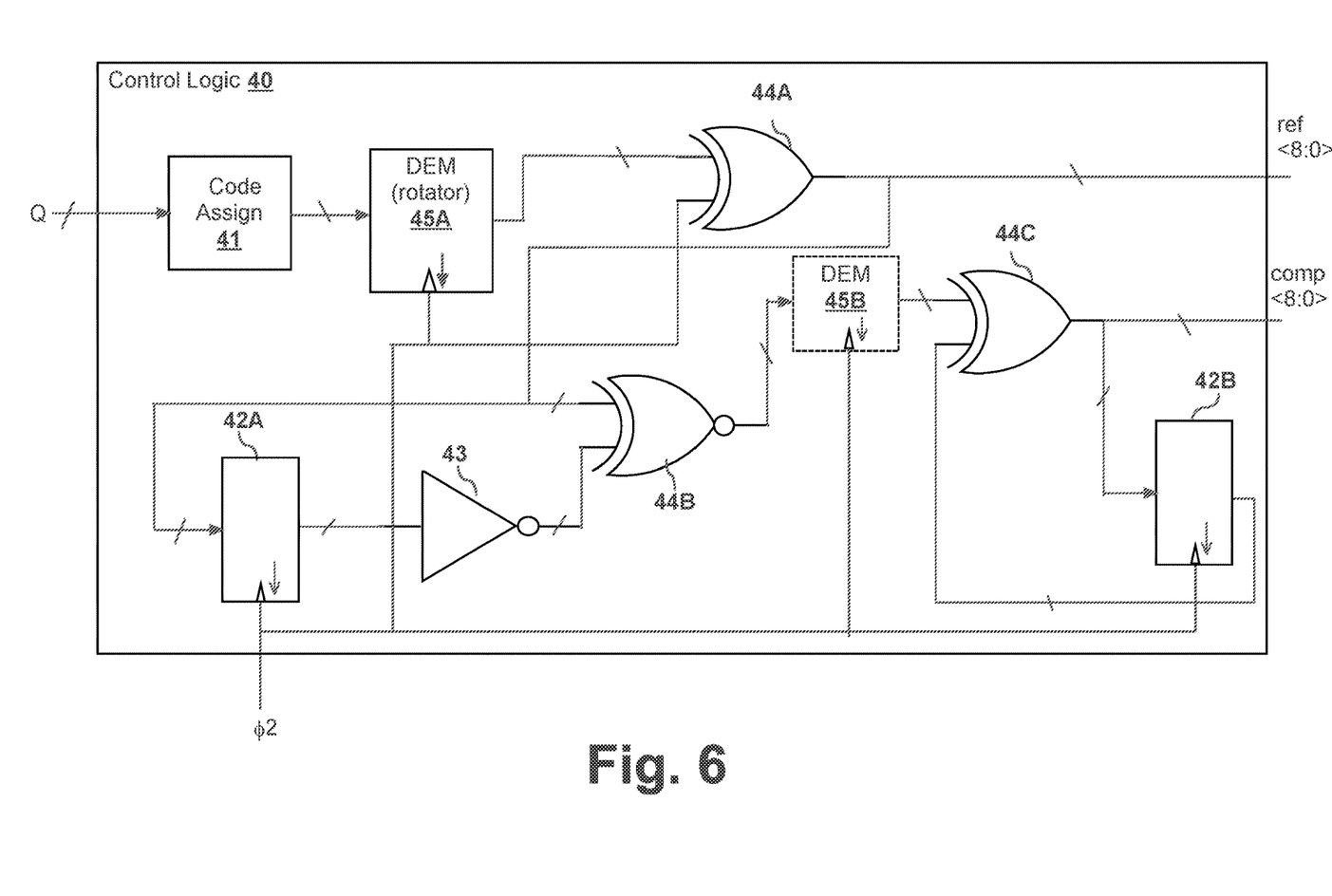
FIG. 6 is a schematic diagram showing details of an example control logic 40 that may be used to implement control logic 26 in delta-sigma loop circuit 30 of FIG. 3.

Referring now to FIG. 6, a schematic of an example control logic 40 that may be used to implement control logic 26 of FIG. 3 is shown. The output Q of quantizer 23 is provided to code assign logic 41 which determines an unrotated set of reference capacitors to select from reference feedback switched-capacitor networks 32A, 32B for the current quantizer output cycle and a DEM logic 45A rotates the output of code assign block 41 at the end of the previous cycle in order to perform dynamic element matching. An exclusive-OR logic gate 44A receives the φ2 clock phase signal, so that the reference capacitor selection word ref<8:0> that selects the capacitors from reference feedback switched-capacitor networks 32A, 32B is inverted by logical exclusive-OR gate 44A for the second clock phase. A latch 42A holds the previous state of reference capacitor selection word ref<8:0>, which is inverted by an inverter 43 and compared to the present state of reference capacitor selection word ref<8:0> by a logical exclusive-OR logic gate 44B to obtain a word indicating the changes in reference capacitor selection word ref<8:0> An optional DEM block 45B rotates the output of exclusive-OR logic gate 44B to vary the selection of polarity for compensation capacitors within compensation capacitor networks 36A, 36B. A latch 42B holds the previous state of the compensation capacitor selection word comp <0:8>, which is generated by a logical exclusive-OR gate 44C that compares the output of DEM block 45B (or the output of logical exclusive-OR gate 44B if DEM block 45B is not included) to the previous state of compensation capacitor selection word comp <0:8> to yield an output having the correct number of bits set to compensate for the capacitors in reference feedback switched-capacitor networks 32A, 32B that are not changing charge state in clock phase φ1 of the current cycle.

In summary, this disclosure shows and describes switched-capacitor delta-sigma data converters having reduced non-linearity and inter-channel cross-talk and their methods of operation. The switched-capacitor delta-sigma data converter circuits comprise a voltage reference circuit providing a voltage reference output, an integrator having an input for receiving an input voltage, a quantizer for generating a digital value quantizing an output of the integrator and on average representing the input voltage, a reference feedback switched-capacitor network alternatively coupled between the voltage reference output and the integrator for providing feedback charge quanta representing an output of the quantizer, and a compensation switched-capacitor network alternatively coupled to the voltage reference output and a return current path for drawing dummy load charge quanta from the voltage reference output that is not provided to the integrator so that a total charge drawn from the voltage reference output when the reference feedback switched-capacitor network is coupled to the voltage reference output does not vary as the input voltage varies.

In some embodiments, the reference feedback switched-capacitor network and the compensation switched-capacitor network may include control logic that selects from among a respective first plurality of reference feedback capacitors and a second plurality of compensation capacitors for coupling to the voltage reference source according to a value of the output of the quantizer. The control logic may compare a previous value of the output of the quantizer and the value of the output of the quantizer to determine which of the plurality of reference feedback capacitors will draw the feedback charge quanta from the voltage reference when selected ones of the plurality of reference feedback capacitors are coupled to the output of the voltage reference, and the control logic may select from among the second plurality of compensation capacitors a number of the second plurality of compensation capacitors for drawing a total dummy load charge quanta that is equal to a number of the plurality of reference feedback capacitors that will not draw the feedback charge quanta when the selected ones of the plurality of reference feedback capacitors are coupled to the output of the voltage reference. The input of the integrator may be a differential switched-capacitor sampled input, and the integrator may be a differential integrator having a positive summing node and a negative summing node.

The reference feedback switched-capacitor network may be operated such that for each cycle of the quantizer, a selected set of the plurality of reference capacitors is coupled to the positive summing node and a remainder of the plurality of reference capacitors is coupled to the negative summing node in a first phase, and during a second phase the remainder of the plurality of reference capacitors may be coupled to the positive summing node and the selected set of the plurality of reference capacitors may be coupled to the negative summing node. The control logic may include a first exclusive-OR operator for comparing an inverse of the previous value of the output of the quantizer and the output of the quantizer to generate an indication of a change in the output of the quantizer, and a second exclusive-OR operator for comparing the indication of a change in the output of the quantizer with a previous value of the output of the control logic to generate an output of the control logic that selects the number of the second plurality of compensation capacitors to be coupled to the voltage reference output, so that changed bits in the output of the control logic indicate the number of the plurality of reference feedback capacitors that will not draw the feedback charge quanta.

The switched-capacitor delta-sigma data converter circuit may include dynamic element matching logic that reassigns a control relationship between bits of the output of the quantizer and corresponding capacitors of the reference feedback switched-capacitor network at each cycle of the output of the quantizer and according to a repeating pattern, so that an impact of variation between the capacitors of the reference feedback switched-capacitor network is reduced. The control logic may account for the reassignment of the corresponding capacitors of the reference feedback switched-capacitor network in generating the output of the control logic that indicates the number of the plurality of reference feedback capacitors that will not draw the feedback charge quanta. The dynamic element matching logic may reassign a control relationship between bits of the output of the quantizer and corresponding capacitors of the compensation switched-capacitor network at each cycle of the output of the quantizer and according to a repeating pattern, so that an impact of variation between the capacitors of the compensation switched-capacitor network on the voltage reference output is reduced. The switched-capacitor delta-sigma data converter circuit may include a filter capacitor charged to a voltage of the voltage reference output, and selected capacitors of the reference feedback switched-capacitor network may be initially charged in first coarse phases in which the selected capacitors are coupled directly to the voltage reference output and in second fine phases following a corresponding first coarse phase in which the selected capacitors may be coupled to the filter capacitor and not the voltage reference output, and the compensation switched-capacitor network may be only coupled to the voltage reference output during the first coarse phases. The switched-capacitor delta-sigma data converter circuit may be included in an analog-to-digital converter system that generates a digital output representing the input voltage from the output of the quantizer.

While the disclosure has shown and described particular embodiments of the techniques disclosed herein, it will be understood by those skilled in the art that the foregoing and other changes in form, and details may be made therein without departing from the spirit and scope of the disclosure.

For example, the techniques shown above may be applied in an IC having a switched-capacitor delta-sigma data converter with an internal filter capacitor.

What is claimed is:

1. A switched-capacitor delta-sigma data converter circuit, comprising:
    a voltage reference circuit providing a voltage reference output;
    an integrator having an input for receiving an input voltage;
    a quantizer for generating a digital value quantizing an output of the integrator and on average representing the input voltage;
    a reference feedback switched-capacitor network alternatively coupled between the voltage reference output and the integrator for providing feedback charge quanta representing an output of the quantizer; and
    a compensation switched-capacitor network alternatively coupled to the voltage reference output and a return current path for drawing dummy load charge quanta from the voltage reference output that is not provided to the integrator so that a total charge drawn from the voltage reference output when the reference feedback switched-capacitor network is coupled to the voltage reference output does not vary as the input voltage varies.

2. The switched-capacitor delta-sigma data converter circuit of claim 1, wherein the reference feedback switched-capacitor network and the compensation switched-capacitor network comprise control logic that selects from among a respective first plurality of reference feedback capacitors and a second plurality of compensation capacitors for coupling to the voltage reference source according to a value of the output of the quantizer, wherein the control logic compares a previous value of the output of the quantizer and the value of the output of the quantizer to determine which of the plurality of reference feedback capacitors will draw the feedback charge quanta from the voltage reference when selected ones of the plurality of reference feedback capacitors are coupled to the output of the voltage reference, and wherein the control logic selects from among the second plurality of compensation capacitors a number of the second plurality of compensation capacitors for drawing a total dummy load charge quanta that is equal to a number of the plurality of reference feedback capacitors that will not draw the feedback charge quanta when the selected ones of the plurality of reference feedback capacitors are coupled to the output of the voltage reference.

3. The switched-capacitor delta-sigma data converter circuit of claim 2, wherein the input of the integrator is a differential switched-capacitor sampled input, and wherein the integrator is a differential integrator having a positive summing node and a negative summing node.

4. The switched-capacitor delta-sigma data converter circuit of claim 3, wherein the reference feedback switched-capacitor network is operated such that for each cycle of the quantizer, a selected set of the plurality of reference capacitors is coupled to the positive summing node and a remainder of the plurality of reference capacitors is coupled to the negative summing node in a first phase, and wherein during a second phase the remainder of the plurality of reference capacitors is coupled to the positive summing node and the selected set of the plurality of reference capacitors is coupled to the negative summing node.

5. The switched-capacitor delta-sigma data converter circuit of claim 4, wherein the control logic comprises:

a first exclusive-OR operator for comparing an inverse of the previous value of the output of the quantizer and the output of the quantizer to generate an indication of a change in the output of the quantizer; and a second exclusive-OR operator for comparing the indication of a change in the output of the quantizer with a previous value of the output of the control logic to generate an output of the control logic that selects the number of the second plurality of compensation capacitors to be coupled to the voltage reference output, whereby changed bits in the output of the control logic indicate the number of the plurality of reference feedback capacitors that will not draw the feedback charge quanta.

6. The switched-capacitor delta-sigma data converter circuit of claim 2, further comprising dynamic element matching logic that reassigns a control relationship between bits of the output of the quantizer and corresponding capacitors of the reference feedback switched-capacitor network at each cycle of the output of the quantizer and according to a repeating pattern, so that an impact of variation between the capacitors of the reference feedback switched-capacitor network is reduced, and wherein the control logic accounts for the reassignment of the corresponding capacitors of the reference feedback switched-capacitor network in generating the output of the control logic that indicates the number of the plurality of reference feedback capacitors that will not draw the feedback charge quanta.

7. The switched-capacitor delta-sigma data converter circuit of claim 6, wherein the dynamic element matching logic further reassigns a control relationship between bits of the output of the quantizer and corresponding capacitors of the compensation switched-capacitor network at each cycle of the output of the quantizer and according to a repeating pattern, so that an impact of variation between the capacitors of the compensation switched-capacitor network on the voltage reference output is reduced.

8. The switched-capacitor delta-sigma data converter circuit of claim 1, further comprising dynamic element matching logic that reassigns a control relationship between bits of the output of the quantizer and corresponding capacitors of the compensation switched-capacitor network at each cycle of the output of the quantizer and according to a repeating pattern, so that an impact of variation between the capacitors of the compensation switched-capacitor network on the voltage reference output is reduced.

9. The switched-capacitor delta-sigma data converter circuit of claim 1, further comprising a filter capacitor charged to a voltage of the voltage reference output, wherein selected capacitors of the reference feedback switched-capacitor network are initially charged in first coarse phases in which the selected capacitors are coupled directly to the voltage reference output and second fine phases following a corresponding first coarse phase in which the selected capacitors are coupled to the filter capacitor and not the voltage reference output, and wherein the compensation switched-capacitor network is only coupled to the voltage reference output during the first coarse phases.

10. The switched-capacitor delta-sigma data converter circuit of claim 1, wherein the switched-capacitor delta-sigma data converter circuit is included in an analog-to-digital converter system that generates a digital output representing the input voltage from the output of the quantizer.

11. A method for removing input signal-dependent voltage variation on an output of a voltage reference of a switched-capacitor data converter, the method comprising:

integrating an input voltage with an analog integrator;

quantizing a result of the integrating;

switching a reference feedback switched-capacitor network to transfer charge from an output of the voltage reference to the analog integrator in conformity with a result of the quantizing; and switching a compensation switched-capacitor network to draw dummy load charge quanta from the voltage reference circuit that is not provided to the analog integrator so that a total charge drawn from the voltage reference circuit when the reference feedback switched-capacitor network is coupled to the voltage reference circuit does not vary as the result of the quantizing varies.

12. The method of claim 11, further comprising comparing a previous value of the output of the quantizer and the value of the output of the quantizer to determine which of the plurality of reference feedback capacitors will draw the feedback charge quanta from the voltage reference when selected ones of the plurality of reference feedback capacitors are coupled to the output of the voltage reference, wherein the switching a reference feedback switched-capacitor network comprises selecting from among a respective first plurality of reference feedback capacitors and a second plurality of compensation capacitors for coupling to the voltage reference source according to the result of the quantizing according to a result of the comparing, and wherein the switching a compensation switched-capacitor network comprises selecting from among the second plurality of compensation capacitors a number of the second plurality of compensation capacitors for drawing a total dummy load charge quanta that is equal to a number of the plurality of reference feedback capacitors that will not draw the feedback charge quanta when the selected ones of the plurality of reference feedback capacitors are coupled to the output of the voltage reference.

13. The method of claim 12, wherein the integrating further comprises sampling the input voltage with a differential switched-capacitor input, and wherein the analog integrator is a differential integrator having a positive summing node and a negative summing node.

14. The method of claim 13, wherein the switching the reference feedback switched-capacitor network is performed such that for each cycle of the quantizing, a selected set of the plurality of reference capacitors is coupled to the positive summing node and a remainder of the plurality of reference capacitors is coupled to the negative summing node in a first phase, and wherein during a second phase the remainder of the plurality of reference capacitors is coupled to the positive summing node and the selected set of the plurality of reference capacitors is coupled to the negative summing node.

15. The method of claim 14, further comprising:

first comparing an inverse of the previous value of the result of the quantizing and the result of the quantizing to generate an indication of a change in the result of the quantizing; and second comparing the indication of a change in the result of the quantizing with a previous value of a result of the second comparing to generate a control value that selects the number of the second plurality of compensation capacitors to be coupled to the output of the voltage reference, whereby changed bits in the result of the second comparing indicate the number of the plurality of reference feedback capacitors that will not draw the feedback charge quanta.

16. The method of claim 12, further comprising reassigning a control relationship between bits of the result of the quantizing and corresponding capacitors of the reference feedback switched-capacitor network at each cycle of the quantizing and according to a repeating pattern, so that an impact of variation between the capacitors of the reference feedback switched-capacitor network is reduced, and wherein the second comparing accounts for the reassignment of the corresponding capacitors of the reference feedback switched-capacitor network in generating the output of the control logic that indicates the number of the plurality of reference feedback capacitors that will not draw the feedback charge quanta.

17. The method of claim 12, further comprising reassigning a control relationship between bits of the result of the quantizing and corresponding capacitors of the compensation switched-capacitor network at each cycle of the output of the quantizer and according to a repeating pattern, so that an impact of variation between the capacitors of the compensation switched-capacitor network on the voltage reference output is reduced.

18. The method of claim 11, further comprising reassigning a control relationship between bits of the result of the quantizing and corresponding capacitors of the compensation switched-capacitor network at each cycle of the quantizing and according to a repeating pattern, so that an impact of variation between the capacitors of the compensation switched-capacitor network on the voltage reference output is reduced.

19. The method of claim 11, further comprising providing a filter capacitor charged to a voltage of the voltage reference output, and wherein the switching a reference feedback switched-capacitor network comprises:

initially charging selected capacitors of the reference feedback switched-capacitor network in first coarse phases in which the selected capacitors are coupled directly to the output of the voltage reference; and subsequently charging the selected capacitors in second fine phases following in which the selected capacitors are coupled to the filter capacitor and not the output of the voltage reference, and wherein the switching a compensation switched-capacitor network only couples capacitors in the compensation switched-capacitor network to the output of the voltage reference during the first coarse phases.

20. The method of claim 14, wherein the switched-capacitor delta-sigma data converter circuit is included in an analog-to-digital converter system that generates a digital output representing the input voltage from the output of the quantizer.

21. A switched-capacitor delta-sigma analog-to-digital converter circuit, comprising:

a voltage reference circuit providing a voltage reference output;

an integrator having an input for receiving an input voltage;

a quantizer for generating a digital value quantizing an output of the integrator and on average representing the input voltage;

a reference feedback switched-capacitor network alternatively coupled between the voltage reference output and the integrator for providing feedback charge quanta representing an output of the quantizer; and a compensation switched-capacitor network alternatively coupled to the voltage reference output and a return current path for drawing dummy load charge quanta from the voltage reference output that is not provided to the integrator so that a total charge drawn from the voltage reference output when the reference feedback switched-capacitor network is coupled to the voltage reference output does not vary as the input voltage varies;

a filter capacitor charged to a voltage of the voltage reference output, wherein selected capacitors of the reference feedback switched-capacitor network are initially charged in first coarse phases in which the selected capacitors are coupled directly to the voltage reference output and second fine phases following a corresponding first coarse phase in which the selected capacitors are coupled to the filter capacitor and not the voltage reference output, and wherein the compensation switched-capacitor network is only coupled to the voltage reference output during the first coarse phases; and a digital filter for receiving the output of the quantizer and generating a digital output representing the input voltage from the output of the quantizer.

* * * * *

UNITED STATES PATENT AND TRADEMARK OFFICE
CERTIFICATE OF CORRECTION

| | |
|---|---|
| PATENT NO. | : 11,223,368 B1 |
| APPLICATION NO. | : 17/061939 |
| DATED | : January 11, 2022 |
| INVENTOR(S) | : Prakash et al. |

It is certified that error appears in the above-identified patent and that said Letters Patent is hereby corrected as shown below:

In the Specification

Column 3, Line 36, delete "DSP 16" and insert -- DSP core 16 --, therefor.

Column 6, Line 54, delete "Vrefrp," and insert -- Vref_rp, --, therefor.

Column 6, Line 58, delete "Vrefrp." and insert -- Vref_rp. --, therefor.

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*